United States Patent [19]

Raschke

[11] Patent Number: 5,045,970

[45] Date of Patent: Sep. 3, 1991

[54] JOINED SUBSTRATES HAVING PLANAR ELECTRICAL INTERCONNECTION OF HYBRID CIRCUITS

[75] Inventor: Curt R. Raschke, Dallas, Tex.

[73] Assignee: Texas Instruments Incorporated, Dallas, Tex.

[21] Appl. No.: 470,404

[22] Filed: Jan. 26, 1990

Related U.S. Application Data

[60] Continuation of Ser. No. 248,706, Sep. 26, 1988, abandoned, which is a division of Ser. No. 53,459, May 22, 1987, Pat. No. 4,815,208.

[51] Int. Cl.⁵ .............................................. H05H 7/20
[52] U.S. Cl. ..................... 361/386; 361/388; 361/405; 361/406; 361/412
[58] Field of Search ............... 361/386, 388, 404, 405, 361/406, 408, 412, 413, 414

[56] References Cited

U.S. PATENT DOCUMENTS 3,747,044 7/1973 Vaccaro ............................ 361/408

FOREIGN PATENT DOCUMENTS 0019919 of 1893 United Kingdom ............... 361/404
1220370 1/1971 United Kingdom ............... 361/414

Primary Examiner—Gregory D. Thompson
Attorney, Agent, or Firm—René E. Grossman; Melvin Sharp

[57] ABSTRACT

The disclosure relates to a hybrid circuit wherein two substrates, preferably, though not necessarily, of diverse materials, are aligned on and secured to a glass plate by layers of polymer which are selectively etchable as to each other. The portion of the topmost polymer layer which is between the substrates is removed and the space therebetween is filled with an electrically insulating material which adheres to the substrates to form a surface between the substrates which is coplanar with the circuit containing surfaces of the substrates. Interconnects are then formed on the electrically insulating surface which extend onto both of the substrates. The remaining polymer layers are removed and the hybrid circuit which has been formed is then placed on a support to provide rigidity and, if necessary, heat sinking properties.

12 Claims, 1 Drawing Sheet

JOINED SUBSTRATES HAVING PLANAR ELECTRICAL INTERCONNECTION OF HYBRID CIRCUITS

This application is a Continuation, of application Ser. No. 07/248,706, now abandoned, filed Sept. 26, 1988 which is a division of U.S. Ser. No. 053459 now U.S. Pat. No. 4,815,208.

BACKGROUND OF THE INVENTION

1. Field of the Invention

This application relates to a hybrid circuit wherein the diverse substrates or chips are joined and the pads of the diverse substrates or chips are interconnected.

2. Brief Description of the Prior Art

A problem which has limited full exploitation of the advantages of hybrid circuits has been that of reliably making electrical interconnection between the chips on a scale consistent with the scale of circuit integration on the chips themselves. A variety of methods exists for making planar interconnections on an appropriate scale. To use these methods, however, requires an adhesive bond between the chips which is uniform and flat to the scale of the interconnection geometry, level with the chip surfaces and rigid and adherent over the planned temperature use range.

The ideal circuit will often be a hybrid with, for example, one part formed from gallium arsenide and the second part form from lithium niobate, where a circuit design cannot be optimized on a single substrate. When such hybrid circuits are used, it is necessary to lithographically interconnect the two different types of substrates. The interconnection presents problems of a type not encountered in the formation of interconnects on a single substrate. The two substrates must be sufficiently close together and sufficiently coplanar whereby standard lithographic techniques can be applied. The two substrates must be coplanar on the order of the line width of the interconnections. Therefore, if the interconnection line widths are, for example, seven microns, the substrates must be coplanar on the order of at least seven microns for the entire length of joint therebetween.

The prior art attempted to solve this problem by glueing the two substrates together in advance and then polishing down both substrates together including the adhesive therebetween whereby, by this polishing action, both substrate surfaces and the intervening adhesive are coplanar. The substrates are then operated upon individually in standard manner to form the circuits therein. This system is economically ineffective, especially when substrates such as gallium arsenide are involved. This is because gallium arsenide processing is so complex and the yield thereof is so low that, statistically, the likelihood of obtaining a hybrid circuit wherein both the gallium arsenide circuit and the second circuit were simultaneously functioning is very small. Accordingly, it is desirable to seek hybrid circuits wherein the statistical likelihood of obtaining such circuits in a completely functional manner is substantially increased.

SUMMARY OF THE INVENTION

In accordance with the present invention, there is provided a hybrid circuit wherein the statistical likelihood of success is materially improved.

Briefly, in accordance with the present invention, the desired circuits are initially formed on the surfaces of the substrates of both materials of the hybrid circuit. The individual circuits are then tested for operability individually with the inoperative circuits being discarded. It is then necessary to interconnect the diverse substrates by running leads from the pads of one substrate to the pads of the other. This has caused a problem in that it is necessary that the circuit containing surfaces of the two diverse substrates being connected as well as the adhesive which holds the substrates together in close proximity to each other be absolultely planar on the order of the width of the photolithographic interconnect lines formed over the adhesive to interconnect the pads of the substrates. This has presented a major problem which is now solved in accordance with the present invention.

Briefly, in accordance with the present invention, a glass slide is provided with markings thereon for accurate placement of the substrates. A first transparent polymer layer with a thickness of 1 to 10 microns and preferably 5 microns which adheres well to glass is then formed over the glass slide. Preferred polymers for this first layer are polymethylmethacrylate, polymethylsiloxane and polyimides of sufficiently low viscosity that they can be deposited uniformly to the desired thickness. An appropriate such material is AZ1350B of American Hoechst. A second transparent polymer layer with a thickness of 1 to 10 microns and preferably 5 microns which adheres to the first polymer layer and is moderately cross-linked is then formed over the first polymer. The polymers which have the desired properties for the first layer will generally be used for the second layer. It is also often possible to use the same polymer for both the first and second layer, in which case the first and second layer are deposited as one layer.

A third polymer layer, which is preferably a photoresist or an uncured polyimide. such as PL-1000 of Hitachi, with a thickness of less than 2 microns and preferably 1 micron is then formed over the second polymer layer which adheres to the second polymer layer and is etchable with an etchant which does not etch the first or second polymer layer. The third polymer layer is either sufficiently thin or sufficiently transparent so that the markings on the glass slide are visible therethrough. The substrates or chips with circuits formed on a surface thereof are then placed on the third layer with the circuit containing surface contacting the third layer and aligned with the markings on the glass slide.

The third polymer layer is then removed in the region between the substrates down to the second polymer layer with an etchant selective to the third layer as opposed to the second and first layer. The etchants can be solvents such as butyl acetate or methyl alcohol or can be oxygen gas in an excited state such as formed in an RF plasma. A fourth polymer in the form of an epoxy, such as a well known casting compound such as Emerson Cumins Stycast 2651-40 which forms a smooth surface or cyanoacrylate or methylacrylic ester, is then introduced into the region between the substrates and cured. The entire assembly is then soaked in a solution which does not attack the fourth layer but removes or makes removable the first and second layers, such as N-butyl acetone, acetone, N-methyl pyrillidone, so that the two substrates joined together by the fourth layer remain. The circuit containing surfaces of the substrates and the intervening adhesive will be essentially coplanar since the glass acts as a planarizing surface therefore during fabrication.

The hybrid circuit thus formed is then placed on a metal support, such as brass, which also provides heat sinking properties thereto. The interconnect lines are then formed between the two substrates over the fourth layer in standard manner using standard lithographic techniques. The device is then packaged in standard manner.

DESCRIPTION OF THE PREFERRED EMBODIMENT

Figure 1:
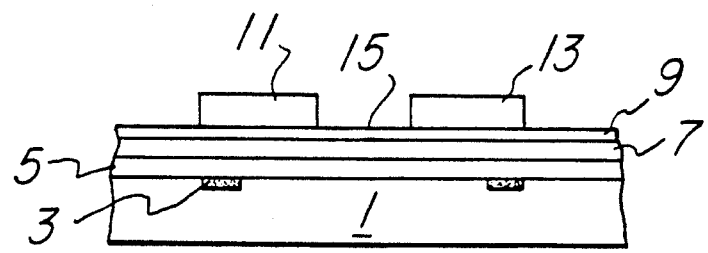
FIGS. 1 to 4 are schematic drawings which depict the result obtained after different manufacturing steps in the process have been performed for formation of the hybrid circuit in accordance with the present invention.

Referring now to the FIGURES and specifically to FIG. 1, there is shown a transparent glass plate 1 having markings 3 thereon for later alignment of chips or substrates. The glass plate defines the planar surface which the remainder of the process will be referenced against. A first transparent polymer layer 5 of polymethylsiloxane having a thickness of 5 microns is then deposited over the plate 1 and a second transparent polymer layer 7 of polymethylmethacrylate having a thickness of 5 microns is deposited over the layer 5. A third thin layer 9 of a photoresist AZ1350B of American Hoechst having a thickness of one micron, which acts as a temporary glue for the chips to be placed on the plate 1, is then deposited over the layer 7 and the substrates 11 and 13 are aligned on the layer 9 in locations determined by the alignment markings 3 on the glass plate 1 which are visible through each of the layers 5, 7 and 9. At this time in the procedure, the system will appear as shown in FIG. 1.

Figure 2:
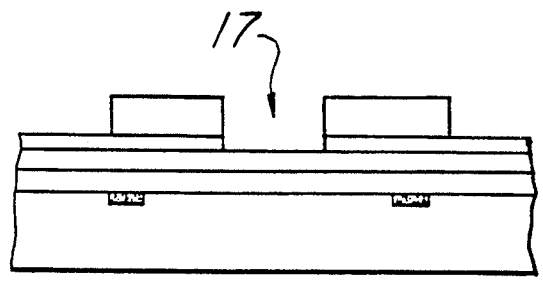
Figure 3:
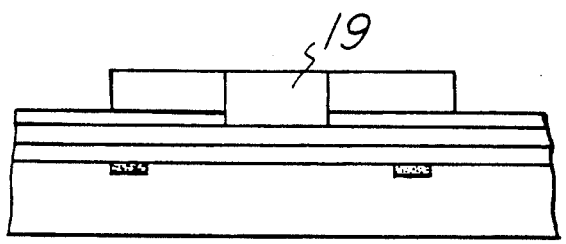

The entire device of FIG. 1 is then masked to permit etching of the portion of the layer 9 which exists in the region 15 between the substrates 11 and 13. The region 15 is then etched away using butyl acetate followed by an oxygen plasma to remove any residues to provide the arrangement as shown in FIG. 2. The space 17 which now exists between the substrates 11 and 13 is then filled with an epoxy 19, such as the casting compound Emerson and Cuming Stycast 2651-40 which forms a smooth surface and degassed to provide the arrangement as shown in FIG. 3 with the epoxy layer 19. The epoxy layer 19 secures the substrates 11 and 13 thereto and forms the surface over which the interconnects will later be formed to form the structure as shown in FIG. 3.

Figure 4:
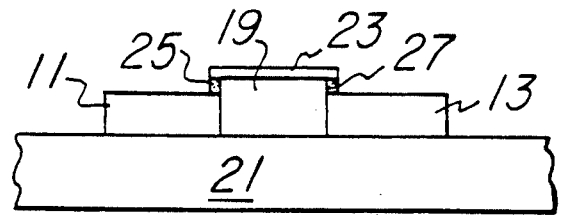
Figure 5:
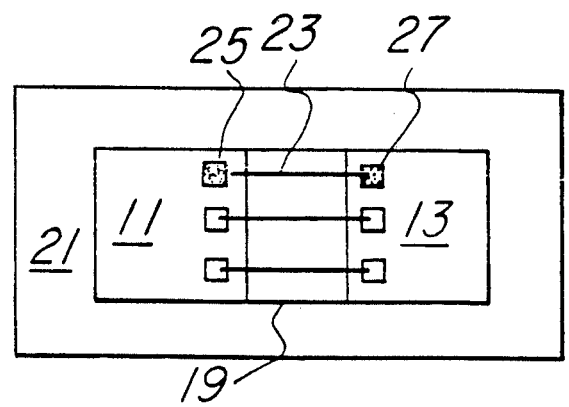
FIG. 5 is a top view of FIG. 4.

The structure as shown in FIG. 3 is then treated with acetone to dissolve the layers 5 and 7 and the remnant of layer 9 to provide the substrates 11 and 13 with circuits formed in the downward facing faces thereof, the substrates being secured together by the epoxy 19 which provides a surface coplanar with the circuit containing surfaces of the substrates. This arrangement is glued with an epoxy to a brass support surface 21 which also acts as a heat sink for the hybrid circuit being formed as shown in FIG. 4. It can be seen that the circuit carrying surface of each of the substrates 11 and 13 is facing away from the support 21. This structure is then patterned with a photo-resist in standard manner and interconnect lines 23 are formed in standard manner which extend from pads 25 on substrate 11 to pads 27 on substrate 13 as shown in FIG. 4 and 5 to form the completed hybrid circuit. The hybrid circuit can then be packaged in standard manner to provide the completed usable circuit.

It can be seen that there has been provided a method for making a hybrid circuit which utilizes few and relatively simple processing steps and which utilizes all operable chips.

Though the invention has been described with respect to active semiconductor substrates it should be understood that other types of substrates, both active and passive, can be substituted for one or both of the substrates herein.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. An electronic hybrid circuit which includes:
  (a) a first semiconductor substrate having an electronic circuit formed on a first surface thereof;
  (b) a second semiconductor substrate spaced from said first semiconductor substrate and having an electronic circuit formed on a first surface thereof;
  (c) a unitary volume of electrically insulating material secured to said first and second substrates, disposed therebetween and having a first surface, each of said first surfaces of said first semiconductor substrate, said second semiconductor substrate and said unitary volume being coplanar; and
  (d) interconnect lines disposed on said electrically insulating material, said interconnect lines extending onto and connected on said first surface of each of said first and second substrates.

2. A circuit as set forth in claim 1 wherein said first substrate and said second substrate are formed of different materials.

3. A circuit as set forth in claim 1 wherein each of said first and second semiconductor substrates has a second surface different from said first surface, further including a unitary heat sink support secured to said second surface of each of said first and second substrates.

4. A circuit as set forth in claim 2 wherein each of said first and second semiconductor substrates has a second surface different from said first surface, further including a unitary heat sink support secured to said second surface of each of said first and second substrates.

5. A circuit as set forth in claim 3 wherein said second surfaces of each of said substrates are coplanar.

6. A circuit as set forth in claim 4 wherein said second surfaces of each of said substrates are coplanar.

7. A circuit as set forth in claim 1 wherein each of said substrates includes pads on said first surface thereof, said interconnect lines being secured to said electrically insulating material and said first surfaces and coupled to predetermined ones of said pads.

8. A circuit as set forth in claim 2 wherein each of said substrates includes pads on said first surface thereof, said interconnect lines being secured to said electrically insulating material and said first surfaces and coupled to predetermined ones of said pads.

9. A circuit as set forth in claim 3 wherein each of said substrates includes pads on said first surface thereof, said interconnect lines being secured to said electrically insulating material and said first surfaces and coupled to predetermined ones of said pads.

10. A circuit as set forth in claim 4 wherein each of said substrates includes pads on said first surface thereof, said interconnect lines being secured to said electrically insulating material and said first surfaces and coupled to predetermined ones of said pads.

11. A circuit as set forth in claim 5 wherein each of said substrates includes pads on said first surface thereof, said interconnect lines being secured to said electrically insulating material and said first surfaces and coupled to predetermined ones of said pads.

12. A circuit as set forth in claim 6 wherein each of said substrates includes pads on said first surface thereof, said interconnect lines being secured to said electrically insulating material and said first surfaces and coupled to predetermined ones of said pads.

* * * * *